United States Patent [19]
Murase

[11] Patent Number: 5,090,035
[45] Date of Patent: Feb. 18, 1992

[54] LINEAR FEEDBACK SHIFT REGISTER

[75] Inventor: Makoto Murase, Tokyo, Japan

[73] Assignee: NEC Corporation, Tokyo, Japan

[21] Appl. No.: 644,259

[22] Filed: Jan. 22, 1991

[30] Foreign Application Priority Data

Jan. 19, 1990 [JP] Japan .................... 2-9673

[51] Int. Cl.$^5$ ........................... G01R 31/28
[52] U.S. Cl. ........................ 377/72; 307/81; 307/73
[58] Field of Search ............ 377/64, 72, 73, 75, 377/76, 78, 80, 81

[56] References Cited

U.S. PATENT DOCUMENTS 3,736,514  5/1973  Lee ..................... 377/75
4,876,704  10/1989 Ozaki ................... 377/75

Primary Examiner—Stanley D. Miller
Assistant Examiner—Sinh N. Tran
Attorney, Agent, or Firm—Helfgott & Karas

[57] ABSTRACT

A linear feedback shift register comprises a shift register formed of first to (n)th flipflops cascaded in such a manner that an output of a (i)th flipflop is connected to an input of a (i+1)th flipflop, where $2 \leq n$ and $1 \leq i \leq (n-1)$. First to (n)th output terminals are connected to outputs of the first to (n)th flipflops, respectively, and a clock terminal connected to a clock input of each of the flipflops. First to (n−1)th multiplexors of a "1-out-of-2" type are connected at their first input to a common preset value input terminal. Second inputs of the first to (n−1)th multiplexors are connected to the outputs of the first to (n−1)th flipflops, respectively. Each of the first to (n−1)th multiplexors has a control input connected to an individual control terminal. First to (n−1)th exclusive-OR gates are cascaded in such a manner that a first input of a (n−1)th exclusive-OR gate is connected to the output of the (n)th flipflop, a first input of an (i)th exclusive-OR gate is connected to an output of an (i+1)th exclusive-OR gate, and an output of the first exclusive-OR gate is connected to an input of the first flipflop. A second input of the (i)th exclusive-OR gate is connected to an output of the (i)th multiplexor. With this arrangement, a generator polynomial generated by the linear feedback shift register can be modified by controlling the multiplexors through the individual control terminals.

8 Claims, 2 Drawing Sheets

LINEAR FEEDBACK SHIFT REGISTER

BACKGROUND OF THE INVENTION

1. Field of the Invention

The present invention relates to a linear feedback shift register (LSFR) for use in a pulse signal test circuit, and more specifically, to a linear feedback shift register capable of modifying a generator polynomial f(x) under control of a multiplexor.

2. Description of Related Art

In the prior art, linear feedback shift registers have been widely used in pseudo random pattern generators and in signature analyzers for error detection in data transmission and others. However, all of the conventional linear shift registers has been constructed to have a fixed generator polynomial.

The conventional linear shift registers having a fixed generator polynomial has various limitations in their actual applications. For example, in a build-up self test of digital circuits such as CPU (central processing unit) and ASIC (application specific integrated circuit) on the basis of a "design for testability", it has been a general practice to construct a register called a "build-in logic block observer". This build-in logic block generator has a test pattern generator function and a data compression function called a "parallel signature analyzer". In a self-test mode, either the test pattern generator or the parallel signature analyzer is selected by an external control signal.

Both of the test pattern generator and the parallel signature analyzer are fundamentally constituted of a liner feedback shift register. When the test pattern generator function is selected, the linear feedback shift register constitutes a pseudo random pattern generator which has a fixed generator polynomial (called a "primitive polynomial") and a maximum period corresponding to the number of bits of the linear feedback shift register.

In general, a plurality of build-in logic block observers are provided in a circuit under test, each one of the build-in logic block observers corresponding to each one divided circuit which is a circuit to be measured or tested, and each output terminal of the test pattern generator forming each one virtual input terminal to the divided circuit. Now, assuming that the divided circuit is a combinational circuit, a pattern having a maximum period corresponding to the number of bits of the linear feedback shift register is ideally required. Also, assuming that the number of bits of the linear feedback shift register is "n", the number of generated patterns becomes $(2^n-1)$. This number of generated patterns can be realized if the number of virtual input terminals of the divided circuit, namely, the number of bits of the linear feedback shift register, is small. However, if the number of virtual input terminals of the divided circuit is large, the above number of patterns cannot be realized because of a limited time for test. As a result, it has been required to fulfil a predetermined degree of fault coverage by use of a restricted number of random patterns.

On the other hand, the divided circuit includes a sequential circuit, the divided circuit have to be sequentially supplied with input signals. Accordingly, even if a pattern of the maximum period corresponding to the number of bits of the linear feedback shift register (which pattern is called a "exhaustive pattern") is used, only incomplete result can be obtained. More still, it is difficult to fulfil the predetermined degree of fault coverage by use of the restricted number of random patterns.

As mentioned above, the linear feedback shift register used in the conventional build-in logic block observer has constituted a fixed generator polynomial in a hardware structure, and therefore, can function only as a generator for a fixed pseudo random pattern. As a result, it has been difficult to realize a self-test having a high degree of fault coverage.

SUMMARY OF THE INVENTION

Accordingly, it is an object of the present invention to provide a linear feedback shift register which has overcome the above mentioned defect of the conventional one.

Another object of the present invention is to provide a linear feedback shift register configured so that a generator polynomial can be changed or modified from an external in order to realize a high degree of fault coverage and to increase efficiency of test.

The above and other objects of the present invention are achieved in accordance with the present invention by a linear feedback shift register comprising a shift register formed of first to (n)th flipflops cascaded in such a manner that an output of a (i)th flipflop is connected to an input of a (i+1)th flipflop, where $2 \leq n$ and $1 \leq i \leq (n-1)$, first to (n)th output terminals connected to outputs of the first to (n)th flipflops, respectively, a clock terminal connected to a clock input of each of the flipflops, first to (n−1)th multiplexors of a "1-out-of-2" type each having a first input connected to a common preset value input terminal, the first to (n−1)th multiplexors having a second input connected to the outputs of the first to (n−1)th flipflops, respectively, each of the first to (n−1)th multiplexors having a control input connected to an individual control terminal, and a first set of exclusive-OR gates composed of first to (n−1)th exclusive-OR gates cascaded in such a manner that a first input of a (n−1)th exclusive-OR gate is connected to the output of the (n)th flipflop, a first input of an (i)th exclusive-OR gate is connected to an output of an (i+1)th exclusive-OR gate, and an output of the first exclusive-OR gate is connected to an input of the first flipflop, a second input of the (i)th exclusive-OR gate being connected to an output of the (i)th multiplexor, whereby a generator polynomial generated by the linear feedback shift register can be modified by controlling the multiplexors through the individual control terminals.

The above and other objects, features and advantages of the present invention will be apparent from the following description of preferred embodiments of the invention with reference to the accompanying drawings.

DESCRIPTION OF THE PREFERRED EMBODIMENTS

Figure 1:
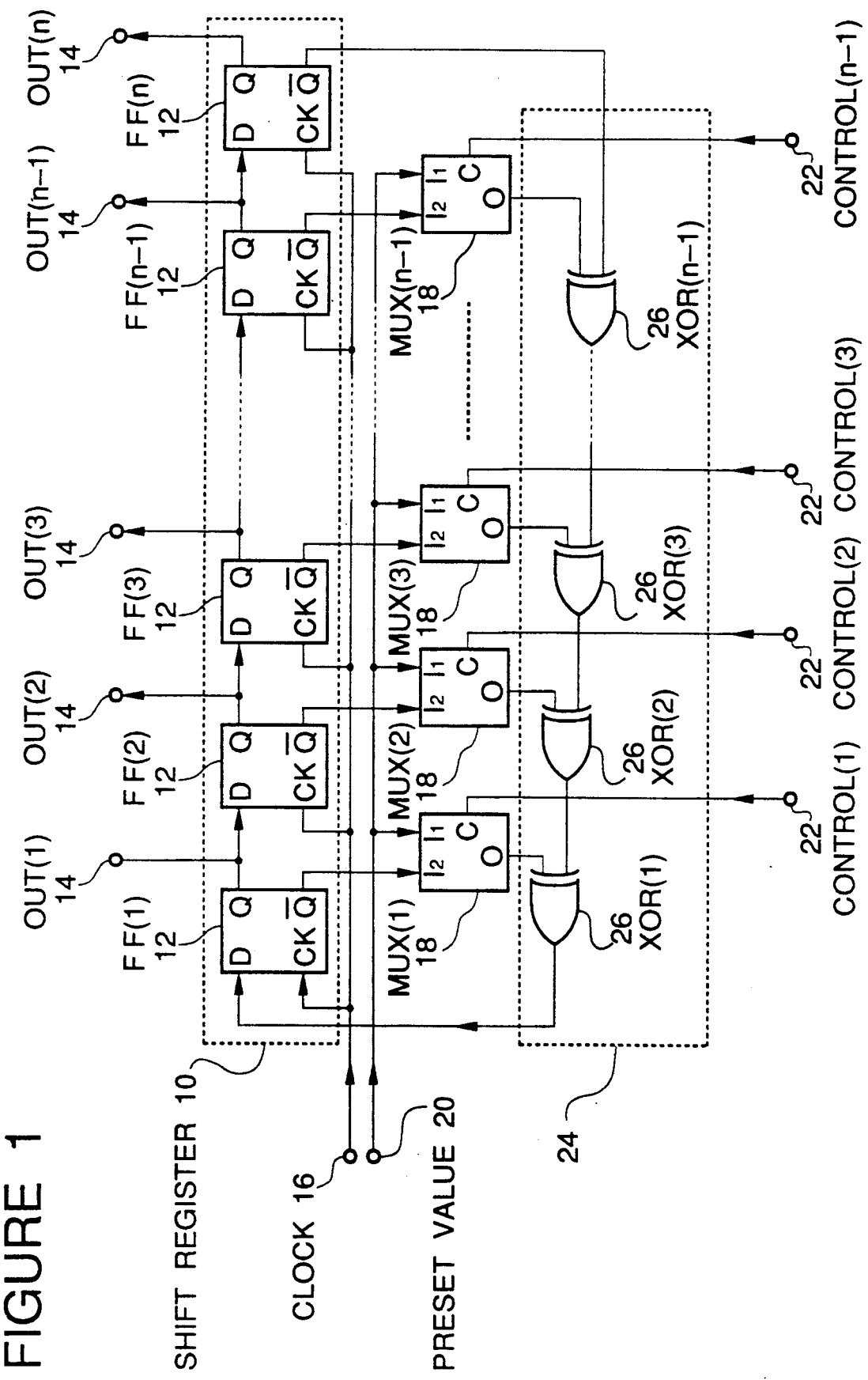
FIG. 1 is a logic block diagram of a first embodiment of the linear feedback shift register in accordance with the present invention.

Referring to FIG. 1, there is shown a logic block diagram of a first embodiment of the linear feedback shift register in accordance with the present invention.

The shown linear feedback shift register includes a shift register 10 formed of first to (n)th flipflops 12 FF(1), FF(2), FF(3), ... FF(n−1) and FF(n) cascaded in such a manner that a Q output of a (i)th flipflop is directly connected to a data input D of a (i+1)th flipflop, where $2 \leq n$ and $1 \leq i \leq (n-1)$. The Q outputs of the flipflops 12 FF(1), FF(2), FF(3), ... FF(n−1) and FF(n) are connected to first to (n)th output terminals 14 OUT(1), OUT(2), OUT(3), ... OUT(n−1) and OUT(n), respectively. Clock inputs CK of all the flipflops 12 FF(1), FF(2), FF(3), ... FF(n−1) and FF(n) are connected in common to a clock terminal 16.

The shown linear feedback shift register also includes first to (n−1)th multiplexors 18 MUX(1), MUX(2), MUX(3), ... and MUX(n−1) of a "1-out-of-2" type, each of which has a first input $I_1$ connected to a common preset value input terminal 20. The multiplexors 18 MUX(1), MUX(2), MUX(3), ... and MUX(n−1) have a second input $I_2$ connected to a $\overline{Q}$ output of the flipflops FF(1), FF(2), FF(3), ... and FF(n−1), respectively. Each of the multiplexors 18 MUX(1), MUX(2), MUX(3), ... and MUX(n−1) has a control input C connected to a corresponding individual control terminal 22 CONTROL(1), CONTROL(2), CONTROL(3), ... or CONTROL(n−1).

A array of exclusive-OR gates 24 is composed of first to (n−1)th exclusive-OR gates 26 XOR(1), XOR(2), XOR(3), ... and XOR(n−1) cascaded in such a manner that a first input of the (n−1)th exclusive-OR gate XOR(n−1) is connected to the $\overline{Q}$ output of the (n)th flipflop FF(n), a first input of an (i)th exclusive-OR gate (where $1 \leq i \leq (n-1)$) is connected to an output of an (i+1)th exclusive-OR gate, and an output of the first exclusive-OR gate XOR(1) is connected to a data input D of the first flipflop FF(1). A second input of the (i)th exclusive-OR gate (where $1 \leq i \leq (n-1)$) is connected to an output "O" of the (i)th multiplexor.

As will be understood from the above description and FIG. 1, by controlling signals supplied to the control terminals CONTROL(1), CONTROL(2), CONTROL(3), ... and CONTROL(n−1) so as to selectively and individually set the conditions of the multiplexors MUX(1), MUX(2), MUX(3), ... and MUX(n−1), the first embodiment of the linear feedback shift register can generate different generator polynomials of the number N:

$$N = \sum_{i=1}^{(n-1)} {}_{(n-1)}C_i$$

In other words, it is possible to generate "N" different pseudo random patterns.

Figure 2:
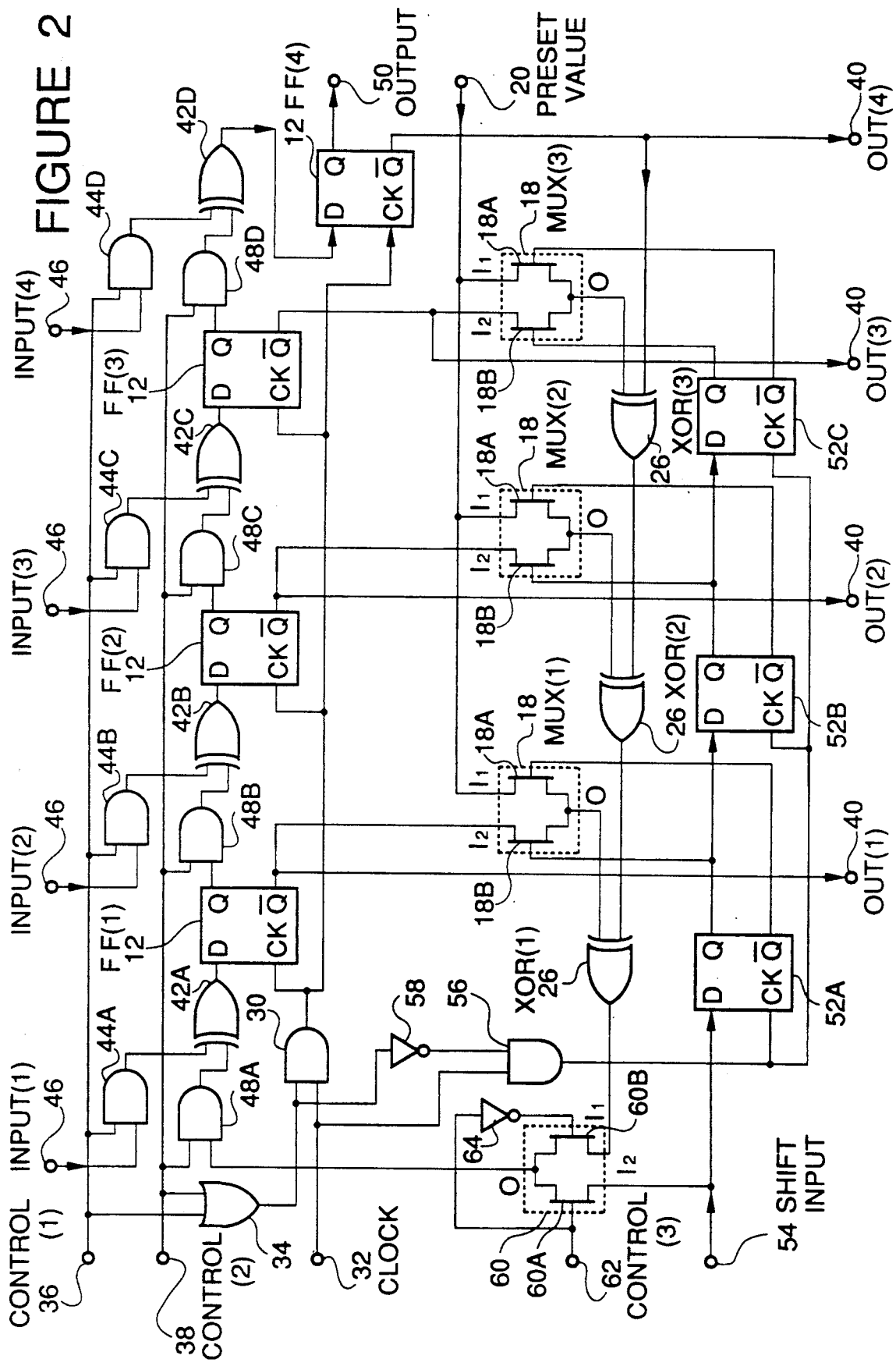
FIG. 2 is a circuit diagram of a second embodiment of the linear feedback shift register in accordance with the present invention.

Turning to FIG. 2, there is shown a circuit diagram of a second embodiment of the linear feedback shift register in accordance with the present invention. The second embodiment of the linear feedback shift register is incorporated in a four-bit build-in logic block observer.

The shown build-in logic block observer includes a shift register formed of first to fourth flipflops 12 FF(1), FF(2), FF(3) and FF(4) cascaded in such a manner that Q outputs of the flipflops FF(1), FF(2) and FF(3) are supplied through their associated signal path to data inputs D of the flipflops FF(2), FF(3) and FF(4), respectively. Clock inputs CK of all the flipflops 12 FF(1), FF(2), FF(3) and FF(4) are connected in common to an output of an AND gate 30, which in turn has a first input connected to a clock terminal 32 CLOCK. A second input of the AND gate 30 is connected to an OR gate 34, which has a first input connected to a first control terminal 36 CONTROL(1) and a second input connected to a first control terminal 38 CONTROL(2).

$\overline{Q}$ outputs of the flipflops FF(1), FF(2), FF(3) and FF(4) are connected to individual parallel output terminals 40 OUT(1), OUT(2), OUT(3) and OUT(4), respectively.

The data input D of each of the flipflops FF(1), FF(2), FF(3) and FF(4) is connected to an output of a corresponding exclusive-OR gate 42A, 42B, 42C or 42D, which in turn has a first input connected to an output of a corresponding AND gate 44A, 44B, 44C or 44D. A first input of each of the AND gates 44A, 44B, 44C and 44D is connected to the first control terminal 36 CONTROL(1). Second inputs of the AND gates 44A, 44B, 44C and 44D are connected to individual parallel input terminals 46 INPUT(1), INPUT(2), INPUT(3) and INPUT(4), respectively. Second inputs of the exclusive-OR gates 42A, 42B, 42C and 42D are connected to outputs of AND gates 48A, 48B, 48C and 48D, respectively. A first input of each of the AND gates 48A, 48B, 48C and 48D is connected to the second control terminal 38 CONTROL(2). Second inputs of the AND gates 48B, 48C and 48D are connected to the Q outputs of the flipflops FF(1), FF(2) and FF(3), respectively. The Q output of the flipflop FF(4) is connected to a serial output terminal 50 OUTPUT.

Furthermore, the $\overline{Q}$ outputs of the flipflops FF(1), FF(2) and FF(3) are connected to second inputs $I_2$ of "1-out-of-2" type multiplexors 18 MUX(1), MUX(2) and MUX(3), respectively, which have their first input $I_1$ connected in common to a common preset value input terminal 20.

First to third exclusive-OR gates 26 XOR(1), XOR(2) and XOR(3) are cascaded in such a manner that a first input of the third exclusive-OR gate XOR(3) is connected to the $\overline{Q}$ output of the fourth flipflop FF(4), and first inputs of the first and second exclusive-OR gates XOR(1) and XOR(2) are connected to outputs of the second and third exclusive-OR gates XOR(2) and XOR(3), respectively. Second inputs of the first to third exclusive-OR gates 26 XOR(1), XOR(2) and XOR(3) are connected to outputs "O" of the first to third multiplexors 18 MUX(1), MUX(2) and MUX(3), respectively.

As shown in FIG. 2, each of the multiplexors 18 MUX(1), MUX(2) and MUX(3) is composed of a pair of field effect transistors 18A and 18B, each of which forms a transfer gate. In the multiplexor MUX(1), for example, the field effect transistor 18A includes a main current path having one end forming the input $I_1$ connected to the preset value input terminal 20, and the field effect transistors 18B includes a main current path having one end forming the input $I_2$ connected to the $\overline{Q}$ outputs of the flipflop FF(1). The other ends of the respective main current paths of the field effect transistors 18A and 18B are connected to each other so as to form the output O of the multiplexor MUX(1).

For the purpose of controlling the three multiplexors 18 MUX(1), MUX(2) and MUX(3) constructed as mentioned above, there is provided a shift register composed of three flipflops 52A, 52B and 52C connected in such a cascaded manner that Q outputs of the flipflops 52A and 52B are connected to data inputs D of the flipflops 52B and 52C, respectively. A data input of the flipflop 52A is connected to a shift input 54, and clock inputs CK of the flipflops 52A, 52B and 52C are connected in common to an output of an AND gate 56, which in turn has a first input connected to the clock terminal 32 CLOCK and a second input connected through an inverter 58 to the output of the OR gate 34. The Q and $\overline{Q}$ outputs of each of the flipflops 52A, 52B and 52C are respectively connected to gate electrodes of the field effect transistors 18B and 18A of the corresponding multiplexor MUX(1), MUX(2) or MUX(3), so that when one of the pair of field effect transistors 18A and 18B is turned on, the other of the pair of field effect transistors 18A and 18B is necessarily turned off.

An output of the first exclusive-OR gates 26 XOR(1) is connected to a first input $I_1$ of a multiplexor 60, which in turn has a second input $I_2$ connected to the shift input 54. This multiplexor 60 is composed of a pair of field effect transistors 60A and 60B, similarly to the multiplexors 26 MUX(1), MUX(2) and MUX(3). One end of a main current path of the field effect transistor 60A forms the input $I_1$ connected to the output of the first exclusive-OR gates 26 XOR(1), and one end of a main current path of the field effect transistor 60B forms the input $I_2$ connected to the shift input 54. The other ends of the respective main current paths of the field effect transistors 60A and 60B are connected to each other so as to form an output O of the multiplexor 60, which output O is connected to a second input of the AND gate 48A. A gate of the field effect transistor 60B is connected to a control input 62 CONTROL(3), and a gate of the field effect transistor 60A is connected through an inverter 64 to the control input 62, so that when one of the pair of field effect transistors 60A and 60B is turned on, the other of the pair of field effect transistors 60A and 60B is necessarily turned off.

With the above mentioned arrangement, a whole sequence of the shown build-in logic block observer is controlled by three control signals CONTROL(1), CONTROL(2) and CONTROL(3) supplied to the control terminals 36, 38 and 62. When the test pattern generator mode is set, all of the control terminals 36, 38 and 62 are brought into a low level. In this condition, a clock is allowed to be supplied to the clock input of the flipflops 52A, 52B and 52C, and the output of the exclusive-OR gate XOR(1) is connected to the AND gate 48A through the multiplexor 60. In addition, serial data for setting a generator polynomial created by the linear feedback shift register is inputted to the shift input terminal 54, so that the serial data is latched in the flipflops 52A, 52B and 52C. As a result, the multiplexors 18 MUX(1), MUX(2) and MUX(3) are respectively controlled by the data latched in the flipflops 52A, 52B and 52C, so that each of the multiplexors 18 MUX(1), MUX(2) and MUX(3) selects either the $\overline{Q}$ output of the corresponding flipflop 12 or the preset value supplied from the preset value input terminal 20. With this, the generator polynomial created by the linear feedback shift register is set by the data latched in the flipflops 52A, 52B and 52C.

Thereafter, the second control terminal 38 CONTROL(2) is brought into a high level, so that the clock is allowed to be supplied through the AND gate 30 to the flipflops 12 FF(1), FF(2), FF(3) and FF(4), and the AND gates 48A, 48B, 48C and 48D are opened. On the other hand, since the first control terminal 36 CONTROL(2) is maintained at the low level, the outputs of the AND gates 44A, 44B, 44C and 44D are at a low level, and therefore, the output of the AND gates 48A, 48B, 48C and 48D are respectively supplied to the data inputs D of the flipflops 12 FF(1), FF(2), FF(3) and FF(4) without modification. At this time, since the AND gate 56 is closed, the data lathed in the flipflops 52A, 52B and 52C is put in a fixed condition. Thus, a four-bit pseudo random pattern in accordance with the set generator polynomial is generated from the parallel output terminal 40 OUT(1), OUT(2), OUT(3) and OUT(4).

On the other hand, when the parallel signature analyzer mode is set, a generator polynomial is set in a manner similar to that in the test pattern generator mode setting. Thereafter, the first and second control terminals 36 and 38 are brought into a high level. In this condition, the clock is allowed to be supplied through the AND gate 30 to the flipflops 12 FF(1), FF(2), FF(3) and FF(4), and the AND gates 48A, 48B, 48C and 48D are opened. Furthermore, signals supplied to the parallel input terminals 46 INPUT(1), INPUT(2), INPUT(3) and INPUT(4) are allowed to be applied to the exclusive-OR gates 42A, 42B, 42C and 42D, respectively, which are connected at their output to the data inputs D of the flipflops 12 FF(1), FF(2), FF(3) and FF(4). Accordingly, data supplied through the parallel input terminals 46 INPUT(1), INPUT(2), INPUT(3) and INPUT(4) is compressed, and compressed data is outputted from the serial output terminal 50. Namely, a signature analyzer is established in accordance with the set generator polynomial.

If the third control terminal 62 CONTROL(3) is brought into a high level, the shift input 54 is connected to the AND gate 48A through the multiplexor 60, and the output of the exclusive-OR gate 26 is blocked at the multiplexor 60. Namely, a feedback loop is cut off. In this condition, if the second control terminal 38 is brought into a high level, the AND gates 30 and 48A, 48B, 48C and 48D are opened, so that the clock is supplied from the clock terminal 32 to all the flipflops 12 and a signal supplied to the shift input terminal 54 is shifted or propagated through the first flipflops 12 FF(1), FF(2), FF(3) and FF(4). Accordingly, the shown circuit functions as a simple shift register, so that a shifted signal is outputted from the serial output terminal 50.

As seen from the above, the linear feedback shift register in accordance with the present invention can change or modify the generator polynomial. Therefore, if a test pattern generator for use in a build-in logic block observer is constituted of the linear feedback shift register in accordance with the present invention, it is possible to generate different pseudo random patterns corresponding to all of the combinations which can be realized in the linear feedback shift register.

At present, it is considered that there is no circuit division method effective in the design for the build-in self test using the build-in logic block observer, and doubts are posed about effectiveness of fault coverage obtained by use of pseudo random patterns generated by the test pattern generator. In addition, it has been necessary to restrict the number of test patterns in order to reduce a required time for test. This requirement is not compatible with a target fault coverage.

However, if the generator polynomial is freely set by using the linear feedback shift register in accordance with the present invention, it is possible to fulfil both the restriction of the test pattern number and target fault coverage, by means of partially merging a plurality of pseudo random patterns in cooperation with a logic fault simulation.

In addition, if a parallel signature analyzer is constituted of the linear feedback shift register in accordance with the present invention, it is possible to improve a judgement error of a defective output subjected to data compression, by using a plurality of generator polynomials.

Furthermore, the linear feedback shift register in accordance with the present invention can be formed by adding only a small amount of additional circuits to a conventional build-in logic block observer, with giving no substantial influence to an overhead.

The invention has thus been shown and described with reference to the specific embodiments. However, it should be noted that the present invention is in no way limited to the details of the illustrated structures but changes and modifications may be made within the scope of the appended claims.

I claim:

1. A linear feedback shift register comprising a shift register formed of first to (n)th flipflops cascaded in such a manner that an output of a (i)th flipflop is connected to an input of a (i+1)th flipflop, where $2 \leq n$ and $1 \leq i \leq (n-1)$, first to (n)th output terminals connected to outputs of said first to (n)th flipflops, respectively, a clock terminal connected to a clock input of each of said flipflops, first to (n−1)th multiplexors of a "1-out-of-2" type each having a first input connected to a common preset value input terminal, said first to (n−1)th multiplexors having a second input connected to the outputs of said first to (n−1)th flipflops, respectively, to an individual control terminal, and a first set of exclusive-OR gates composed of first to (n−1)th exclusive-OR gates cascaded in such a manner that a first input of a (n−1)th exclusive-OR gate is connected to the output of the (n)th flipflop, a first input of an (i)th exclusive-OR gate is connected to an output of an (i+1)th exclusive-OR gate, and an output of the first exclusive-OR gate is connected to an input of the first flipflop, a second input of the (i)th exclusive-OR gate being connected to an output of the (i)th multiplexor, whereby a generator polynomial generated by the linear feedback shift register can be modified by controlling said multiplexors through said individual control terminals.

2. A linear feedback shift register claimed in claim 1 further including a second set of exclusive-OR gates composed of first to (n)th exclusive-OR gates arranged in such a manner that an output of an (i)th exclusive-OR gate of said second set of exclusive-OR gates is connected to the input of said (i)th flipflop, and a first input of the (i)th exclusive-OR gate of said second set of exclusive-OR gates is connected to receive an individual input signal, a second input of the first exclusive-OR gate of said second set of exclusive-OR gates being connected to receive the output of said first exclusive-OR gate of said first set of exclusive-OR gates, and a second input of the (i+1)th exclusive-OR gate of said second set of exclusive-OR gates being connected to receive the output of said (i)th flipflop.

3. A linear feedback shift register claimed in claim 2 wherein said first input of each (i)th exclusive-OR gate of said second set of exclusive-OR gates is connected to an output of a first AND gate having a first input connected to receive said individual input signal and a second input connected in common to a first control terminal.

4. A linear feedback shift register claimed in claim 3 wherein said second input of each (i)th exclusive-OR gate of said second set of exclusive-OR gates is connected to an output of a second AND gate having a first input connected in common to a second control terminal, said output of the (i)th flipflop being connected to a second input of said second AND gate whose output is connected to said second input of each (i+1)th exclusive-OR gate of said second set of exclusive-OR gates connected to the input of the (i+1)th flipflop, and the second input of said second AND gate whose output is connected to said second input of each first exclusive-OR gate of said second set of exclusive-OR gates connected to the input of the first flipflop being connected to receive the output of said first exclusive-OR gate of said first set of exclusive-OR gates.

5. A linear feedback shift register claimed in claim 4 wherein the second input of said second AND gate whose output is connected to said second input of each first exclusive-OR gate of said second set of exclusive-OR gates connected to the input of the first flipflop is connected to an output of a second multiplexor having a first input connected to the output of said first exclusive-OR gate of said first set of exclusive-OR gates, a second input of said second multiplexor being connected to a shift input and a control input of said second multiplexor being connected to a third control terminal.

6. A linear feedback shift register claimed in claim 5 further including an OR gate having first and second inputs connected to said first and second control terminals, respectively, and a third AND gate having a first input connected to an output of said OR gate and a second input connected to said clock terminal, an output of said third AND gate being connected in common to said clock input of each of said flipflop.

7. A linear feedback shift register claimed in claim 6 further including a second shift register of (n−1) stages having a serial input connected to said shift input, an output of each stage of said second shift register being connected to said control input of a corresponding multiplexor.

8. A linear feedback shift register claimed in claim 7 wherein said serial input of said second shift register is connected to an output of a fourth AND gate having a first input connected to said clock terminal and a second input connected to the output of said OR gate through an inverter.

* * * * *